(12) United States Patent
Vacula et al.

(10) Patent No.: US 8,134,187 B2
(45) Date of Patent: Mar. 13, 2012

(54) INTEGRATED MASK-PROGRAMMABLE LOGIC DEVICES WITH MULTIPLE METAL LEVELS AND MANUFACTURING PROCESS THEREOF

(75) Inventors: Patrik Vacula, Humenne (CZ); Milos Vacula, Humenne (CZ); Milan Lzicar, Jinocany (CZ)

(73) Assignee: STMicroelectronics Design and Application s.r.o., Prague (CZ)

( * ) Notice: Subject to any disclaimer, the term of this patent is extended or adjusted under 35 U.S.C. 154(b) by 266 days.

(21) Appl. No.: 12/343,621

(22) Filed: Dec. 24, 2008

(65) Prior Publication Data

US 2009/0166683 A1 Jul. 2, 2009

(30) Foreign Application Priority Data

Dec. 29, 2007 (EP) ..................................... 07150488

(51) Int. Cl.
  *H01L 29/66* (2006.01)
  *H01L 21/00* (2006.01)
  *H01L 23/48* (2006.01)
  *H01L 27/10* (2006.01)

(52) U.S. Cl. ......... 257/211; 257/E21.001; 257/E29.166; 257/209; 257/208; 257/202; 257/797; 257/210; 257/48; 257/601; 438/128

(58) Field of Classification Search .................. 257/211, 257/208, 202, 203, 601, 698, E29.166, E21.001, 257/209, 797, 758, 210, 48; 438/128
See application file for complete search history.

(56) References Cited

U.S. PATENT DOCUMENTS

| | | | |
|---|---|---|---|
| 5,091,328 A * | 2/1992 | Miller | 438/278 |
| 5,408,428 A | 4/1995 | Burgess | |
| 6,133,582 A * | 10/2000 | Osann et al. | 257/48 |
| 6,399,400 B1 * | 6/2002 | Osann et al. | 438/14 |
| 6,404,226 B1 * | 6/2002 | Schadt | 326/41 |
| 6,629,309 B1 | 9/2003 | Allen | |
| 7,418,692 B2 * | 8/2008 | Bansal | 716/102 |
| 2003/0001173 A1 * | 1/2003 | Denham | 257/209 |
| 2004/0201098 A1 * | 10/2004 | Corrigan | 257/758 |
| 2010/0100861 A1 * | 4/2010 | Frederick | 716/9 |

OTHER PUBLICATIONS

European Search Report dated May 22, 2008 from corresponding European Application No. 07150488.0.

* cited by examiner

*Primary Examiner* — A O Williams
(74) *Attorney, Agent, or Firm* — Wolf, Greenfield & Sacks, P.C.

(57) ABSTRACT

Integrated mask-programmable device, having a plurality of metal levels including a top metal level, a bottom metal level and a first intermediate metal level formed between the top and bottom metal levels, and a plurality of via levels arranged between the bottom and the first intermediate metal levels and between the first intermediate and the top metal levels and connecting each metal level to adjacent metal levels. The plurality of metal levels forms a first, a second and at least a third terminal, the top and bottom metal levels having at least two metal regions, and the first intermediate metal level having at least three metal regions. The first terminal is connected to third terminal or the second terminal is connected to the third terminal by modifying a single metal or via level.

24 Claims, 9 Drawing Sheets

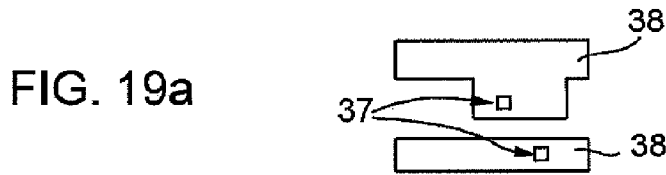
FIG. 19a
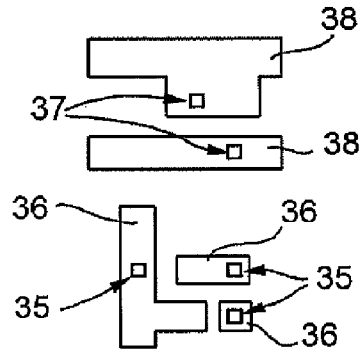
FIG. 19b
FIG. 19c
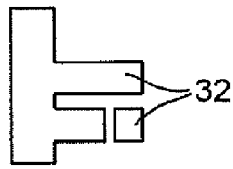
FIG. 19d
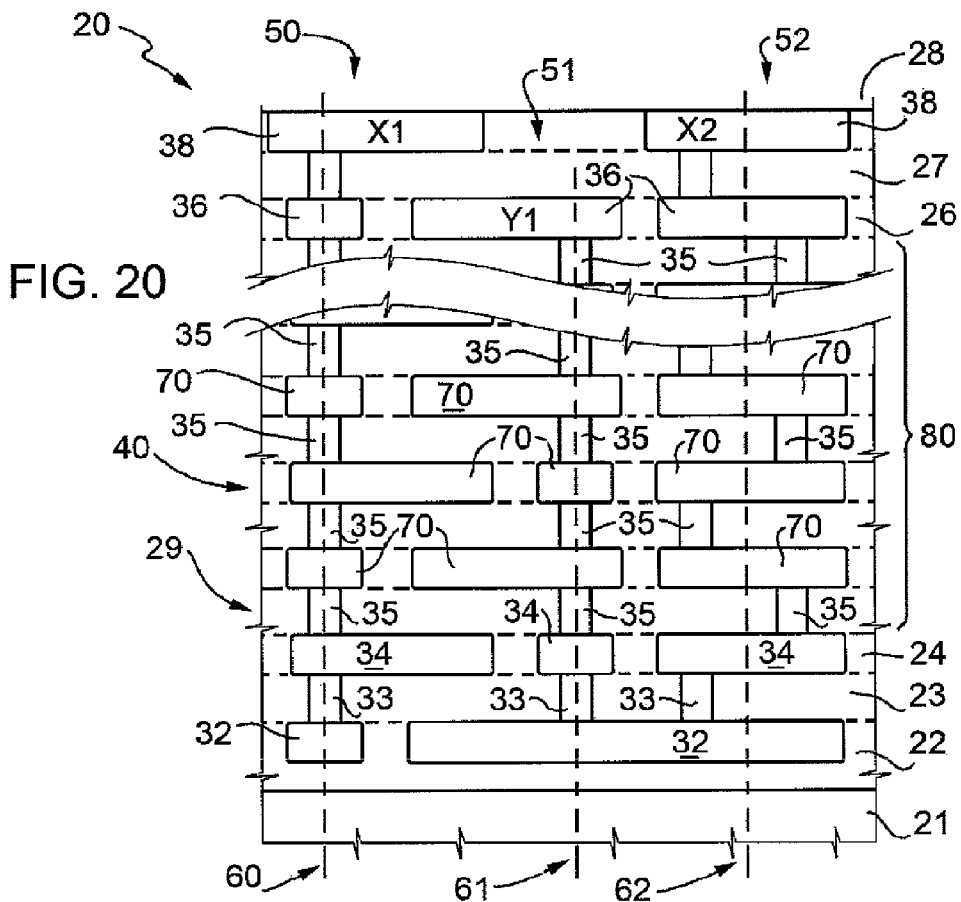
FIG. 20

INTEGRATED MASK-PROGRAMMABLE LOGIC DEVICES WITH MULTIPLE METAL LEVELS AND MANUFACTURING PROCESS THEREOF

CROSS REFERENCE TO RELATED APPLICATIONS

This application claims the priority benefit of European patent application number 07150488.0, filed on Dec. 29, 2007, entitled "Flexible Layout for Integrated Mask-Programmable Logic Devices and Manufacturing Process Thereof," which is hereby incorporated by reference to the maximum extent allowable by law.

FIELD OF THE INVENTION

The present invention relates to a flexible layout for integrated mask-programmable logic devices and the manufacturing process thereof and more particularly to the layout and process for forming a mask-programmed logic device implemented in metal levels.

DISCUSSION OF THE RELATED ART

As is known, programmable logic devices may be obtained in a variety of different ways. One-time configurable logic devices include, for example, devices having fusible links; the configuration procedure in this case resides in selectively blowing links so as to obtain the needed electrical configuration. As an alternative to this procedure, read-only memories (ROM) have been widely used to store a particular configuration according to the needs of the user. ROM-based devices do not generally allow the user to modify the configuration set and do not give the person skilled in the art the ability to change the configuration a second time.

Reprogrammable logic devices have been introduced later in time. Such devices incorporate an erasable programmable read-only memory (EPROM), that allows the device to be reconfigured when needed.

As an alternative to logic devices whose logic functions and interconnect resources are programmable, mask-programmable logic devices have been introduced. According to this technology, a manufacturer produces a mask programmable base device, with a defined arrangement of logic resources, whose functions can be programmed by the manufacturer, e.g. on the basis of user request, during the manufacturing process. By using proper masks, it is possible to conveniently generate a number of metal levels and connections between them that allow the device to behave in a determined way. For example, the user first provides the manufacturer of the mask-programmable logic device with the specifications of a desired device; then, these specifications are used by the manufacturer during the device manufacturing process to add metallization levels to the base device and to make fixed connections between them so as to physically implement specific logic functions.

While conventional programmable logic devices allow a flexible design of a device devoted to perform a desired function, they inevitably include extra resources that may not be used in particular designs of devices intended for a precise application. Moreover, in order to accommodate general purpose routing, interconnect and switching resources (to allow signals from any resource to reach any other resource), conventional programmable logic devices are usually larger and comprise more functionality than needed for a particular purpose. As a consequence, the size and the power consumption of such devices are considerably higher as compared with expressly designed devices.

Mask-programmable technology applied to logic devices has allowed users to commit to a manufacturer the production of logic devices by providing conventional design specifications and at the same time has allowed manufacturers to produce mask-programmed logic devices having significantly reduced dimensions and low power consumption, because only those interconnect and routing resources actually needed for the particular design are implemented in metal levels. In addition there are no general purpose resources consuming space or power, or increasing the total capacitance of the device.

U.S. Pat. No. 6,742,172, and U.S. Pat. No. 7,165,230, provide methods of manufacturing a mask-programmable logic device from a pre-existing circuit design reducing at the same time the die area and the power requirement and increasing the performance and yield. Smart switches in place of configuration-related logic circuitry are provided, with the aim of facilitating, without transistors, the functionality of a configuration-related logic circuitry previously implemented on another integrated circuit.

For a better comprehension, reference is made to FIG. 1, showing a schematic representation of a two-inputs smart switch 1 having a first input terminal 2, a second input terminal 3 and an output terminal 4. The smart switch 1 is considered to be programmable to the extent that interconnection conductors may be coupled to the contact pins within the switch. Such a kind of programmability allows a generic smart switch 1 to form a "smart cell" with a specific function. The actual layout of any individual smart switch 1 is strictly dependent on the particular functionality that it is intended to implement. Several different types of smart switches 1 having different layouts and sizes may also be interconnected together to perform a particular logic function. By coupling each terminal of the smart switch 1 to appropriate signal lines or logic value sources, a wide range of logic functions may be implemented, such as AND gates, OR gates, NOR gates, XOR gates, inverters, buffers, combination thereof, etc.

FIG. 2 shows a cross-section of a mask-programmed device 10, in which several metallization levels 11 and several dielectric levels 12 are formed over a base device 13 to create a custom interconnect network that connects resource 14 included in the base device 13 with any other resource in the same or a different device.

Therefore, a variety of different mask-programmed devices 10 having different functions may be built each on a mask-programmable base device 13 having same logic resources, memory, I/Os, etc.

In order to build devices (e.g. smart switches 1) having variable input-output connections, mask-programmable technology usually requires the modification of the layout of more than one metal mask during the development process. In combination with the current trend of dimension shrinkage, the cost of the masks is constantly growing and it is becoming one of the main issues that slow down the growth of mask-programmable based technology. Therefore, there is the need for a mask-programmable device that is independent as much as possible from metal interconnection changes.

SUMMARY OF THE INVENTION

An object of the invention is thus to provide a flexible layout and process that take into account the above need.

According to one embodiment there is provided an integrated mask-programmable device, comprising a plurality of metal levels including a top metal level, a bottom metal level and a first intermediate metal level formed between said top and bottom metal levels, a plurality of via levels arranged between the bottom and the first intermediate metal levels and between the first intermediate and the top metal levels and connecting each metal level to adjacent metal levels, said plurality of metal levels forming a first, a second and at least a third terminal, said top and bottom metal levels comprising at least two metal regions, and said first intermediate metal level comprising at least three metal regions.

According to another embodiment, thereis provided a method for forming an integrated mask-programmable device, comprising the steps of forming a plurality of metal levels including a top metal level, a bottom metal level and a first intermediate metal level formed between said top and bottom metal levels, forming a plurality of via levels arranged between the bottom and the first intermediate metal levels and between the first intermediate and the top metal levels and connecting each metal level to adjacent metal levels, said plurality of metal levels defining a first, a second and at least a third terminal, said top and bottom metal levels comprising at least two metal regions, and said first intermediate metal level comprising at least three metal regions, connecting said first terminal to said third terminal or said second terminal to said third terminal by modifying a single metal or via level.

BRIEF DESCRIPTION OF THE DRAWINGS

For an understanding of the present invention, preferred embodiments thereof are now described, purely as non-limitative examples, with reference to the enclosed drawings, wherein:

FIGS. 13, 14a-14d, 15, 16, 17a-17d, 18, 19a-19d, show top views and metal patterns of alternative layouts according to further embodiments;

FIGS. 20-21 show cross-sections of switches having, respectively, an even and an odd number of metal levels;

DETAILED DESCRIPTION

Figure 1:
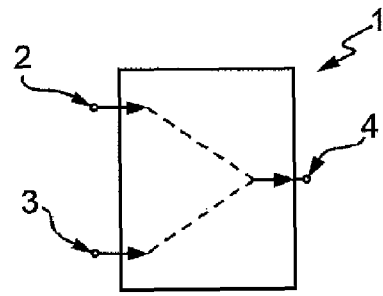
FIG. 1 shows a schematic representation of a switch having two inputs and one output.
Figure 2:
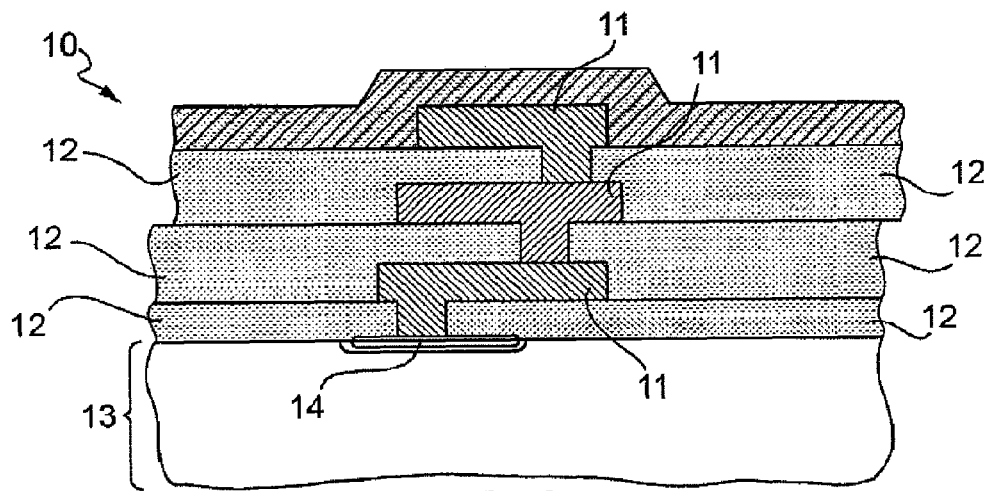
FIG. 2 shows a cross-section of a mask programmed device according to a known solution.
Figure 3:
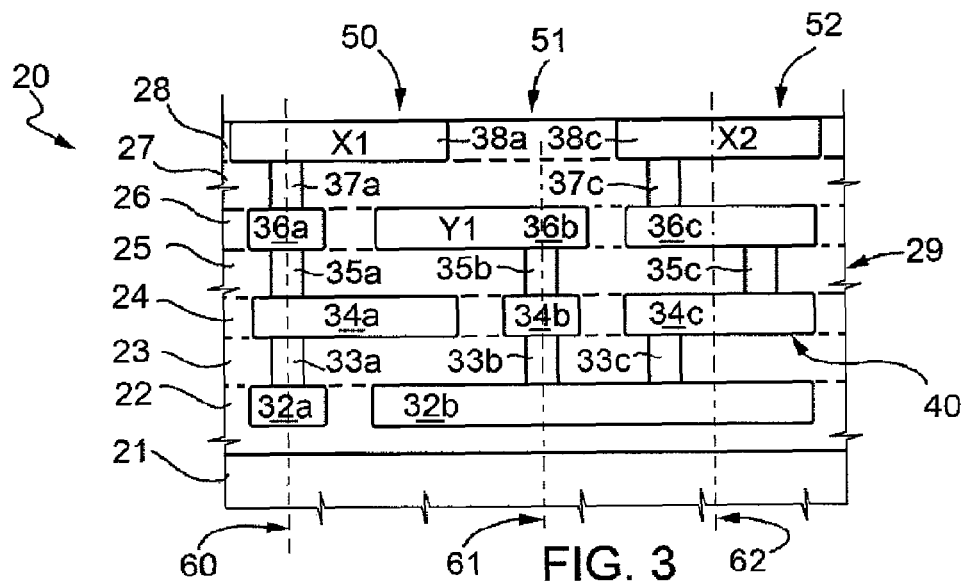
FIG. 3 shows a cross-section of a basic topology of a switch according to an embodiment of the present invention.

FIG. 3 shows a cross-section of a basic topology for a switch 20 having four metal levels and two states. In the shown topology, the switch 20 acts as a three-port switch, having two inputs (X1 and X2) and one output (Y1). In the alternative, X1 and X2 are two outputs, and Y1 is an input. Therefore, in the following, as an example only, inputs X1, X2 and output Y1 will be named first, second and third terminals.

In detail, the switch 20 comprises a base or substrate 21 and a series of dielectric layers, indicated for simplicity, as a whole, dielectric layer 29, accommodating a first metal level 22, a first via level 23, a second metal level 24, a second via level 25, a third metal level 26, a third via level 27, a fourth metal level 28. Each metal level comprises at least two metal regions, so that the first metal level 22 comprises first metal regions 32, second metal level 24 comprises second metal regions 34, third metal level 26 comprises third metal regions 36, and forth metal level 28 comprises fourth metal regions 38. Analogously, first via level 23 comprises first via connections 33, second via level 25 comprises second via connections 35, and third via level 27 comprises third via connections 37. In this way, the metal regions 32, 34, 36, 38, connected together by the via connections 33, 35, 37, form a metal network 40.

In more detail, the metal network 40 is a multi-stack structure formed by the metal regions 32, 34, 36, 38. In FIG. 3, the second and third metal levels 24, 26 comprise three second metal regions 34 and three third metal regions 36, while the first and fourth metal levels 22, 28 comprise two first metal regions 32 and two fourth metal regions 38. The metal regions 32a, 34a, 36a, 38a, on the left side of the device of FIG. 3 are connected by via connections 33a, 35a, 37a, and form a first stack 50. Analogously, the metal regions 34b, 36b, in the middle of FIG. 3 are connected to each other and to the metal region 32b, that extends from the center to the right side, by via connections 33b, 35b, and form a second stack 51. The metal regions 34c, 36c, 38c, on the right side are connected to each other and to the metal region 32b, by via connections 33c, 35c, 37c, and form a third stack 52. In this embodiment, the second stack 51 and the third stack 52 share the first metal region 32b; therefore the first metal region 32b, forms an electrical connection between the two metal stacks 51, 52.

The via connections 33a, 35a, 37a, of the first stack 50 are aligned along a same first vertical axis 60, the via connections 33b, 35b, of the second stack 51 are aligned on a same second vertical axis 61, and the via connections 33c, 35c, 37c, of the third stack 52 are arranged alternately on either sides of a third vertical axis 62. Therefore, in the third stack 52, the via connections 33c, 35c, 37c, are aligned along two parallel vertical axes, each via connection 33c, 35c, 37c, being offset with respect to a preceding and/or a subsequent via connection.

First, second, third, fourth metal regions 32, 34, 36, 38, first, second, third via connections 33, 35, 37 and the dielectric layer 29 may be formed with any allowable process and technology, since the present flexible layout for mask programmable devices is independent from the conductivity type of the material and from technology aspects. For example, they may be formed by depositing and shaping metal layers, and respective dielectric layers. In the alternative, the damascene technique may be used. A combination of the above two techniques is also possible. The metal regions may be, e.g., of copper, polysilicon, aluminium alloy, or any conductive material and the via connections are of any conductive material, e.g. copper, tungsten, polysilicon, etc.

Figure 4:
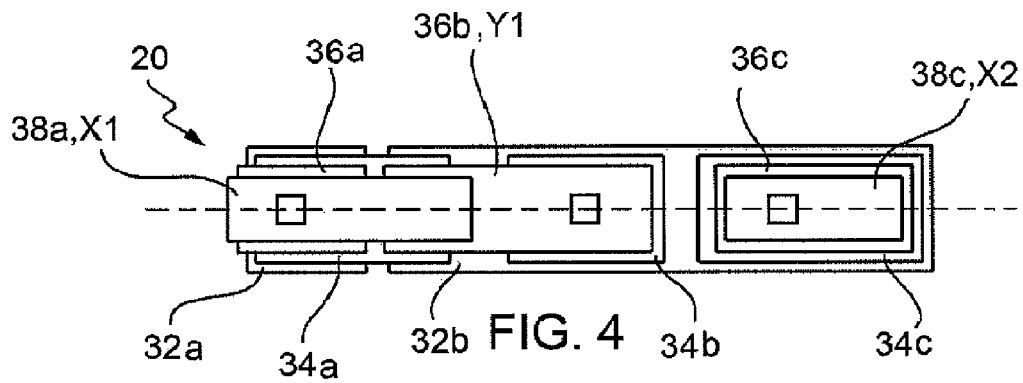
FIG. 4 shows a top view of the switch according to FIG. 3.
Figure 5A:
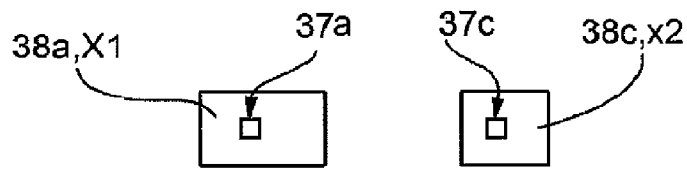
FIGS. 5a-5d, show a top view of the pattern of the different metal levels of the switch of FIGS. 3 and 4.
Figure 5B:
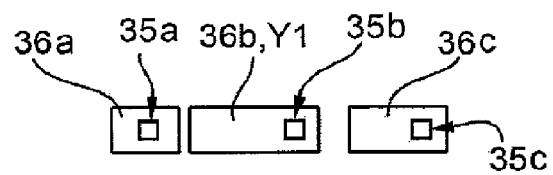
Figure 5C:
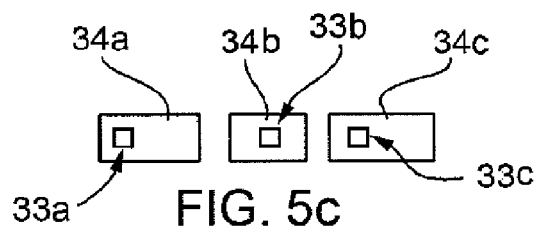
Figure 5D:
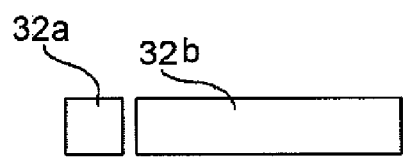

FIG. 4 shows the layout of the switch 20 of FIG. 3, and FIGS. 5a-5d show exemplary shapes of the metal regions 32, 34, 36, 38 forming the switch 20. In detail, the metal regions 32, 34, 36, 38 are shaped as polygons, for example rectangular metal strips. The first via connections 33 are shown with broken lines on the second metal regions 34, the second via connections 35 are shown on the third metal regions 36 and the third via connections 37 are shown on the fourth metal region 38.

The implementation of a metal structure of this kind, comprising top metal regions and bottom metal regions (i.e., two first metal regions 32 and two fourth metal regions 38) and intermediate metal regions (i.e., three second metal regions 34 and three third metal regions 36), allows a manufacturer to design any possible connection between either first and second terminal X1 or X2 (the fourth metal regions 38) and the third terminal Y1 (the third metal region 36b, in the middle of FIG. 3) by simply modifying a single metal or via level only (thus introducing only one new metal or via mask during fabrication process).

Practical examples of different input-output connections obtained by modifying only a single metal level or a single via level are provided in FIGS. 6-12. In detail, FIGS. 6-12 show equivalent alternative ways to disconnect the fourth metal region 38c, forming second terminal X2 from the third metal region 36b, forming third terminal Y1 of the switch 20 of FIG. 3 and to connect the fourth metal region 38a, forming first terminal X1 to third terminal Y1. In each proposed alternative, only the metal regions or the via connections comprised in one respective metal or via level are modified with respect to FIGS. 3, 4, 5a-5d.

Figure 6:
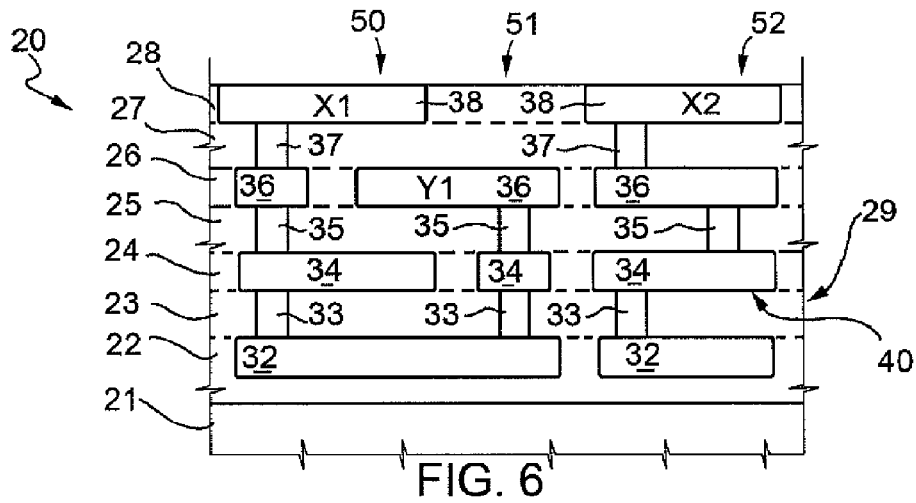
FIGS. 6-12 show alternative solutions for the present switch metal connection.

In FIG. 6, the first metal regions 32 have been modified so as to shorten the right-hand first metal region 32 and to lengthen the left-hand first metal region 32, so that the right-hand first metal region 32 is connected only to the right-hand second metal region 34 and the left-hand first metal region 32 is connected now to two, left-hand and central second metal regions 34.

Figure 7:
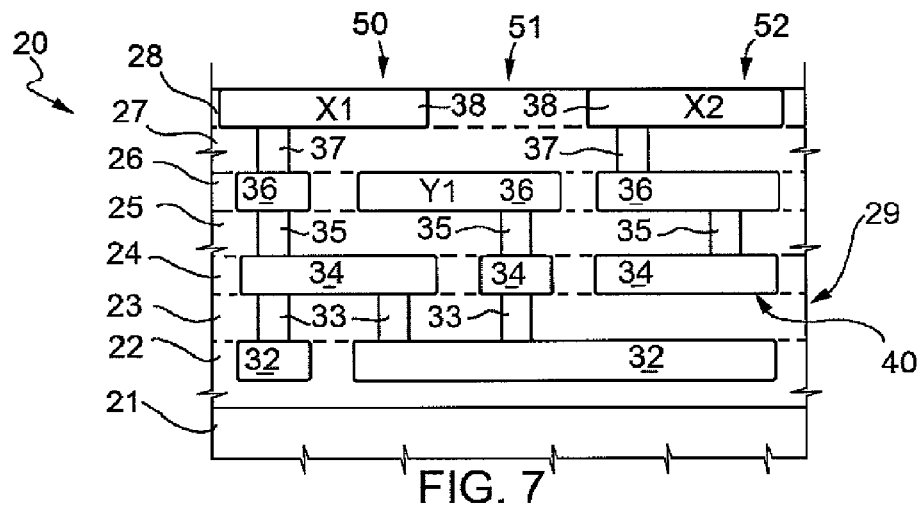
Figure 8:
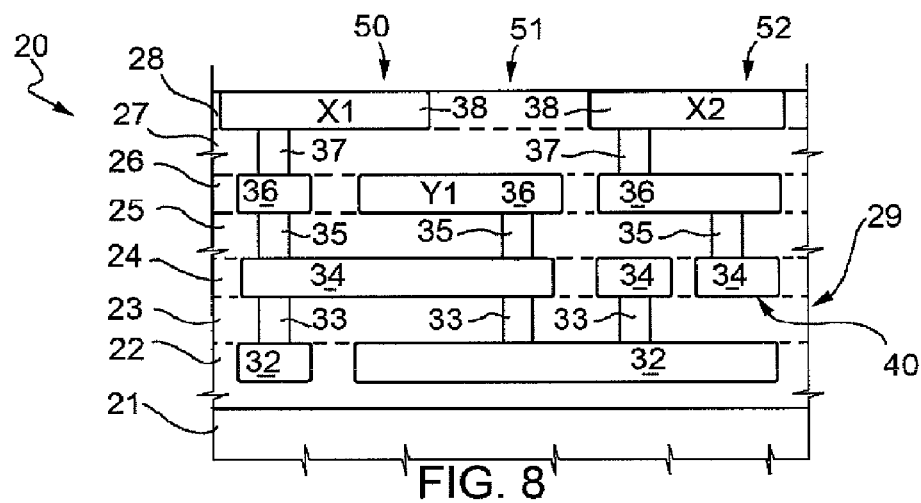

In FIG. 7, a single right-hand via connection 33, in the first via level 23, has been removed between the right-hand first metal region 32 and the right-hand second metal region 34, and a new via connection 33 has been formed between the right-hand first metal region 32 and the left-hand second metal region 34. In FIG. 8, the second metal region 34 has been modified so to lengthen the left-hand second metal region 34 that now includes also the central second metal region 34, and to divide in two parts the right-hand second metal region 34. In this way, the left-hand second metal region 34 electrically connects first terminal X1 and third terminal Y1, while the division in two separate metal regions of the right-hand second metal region 34 electrically isolate second terminal X2 from third terminal Y1.

Figure 9:
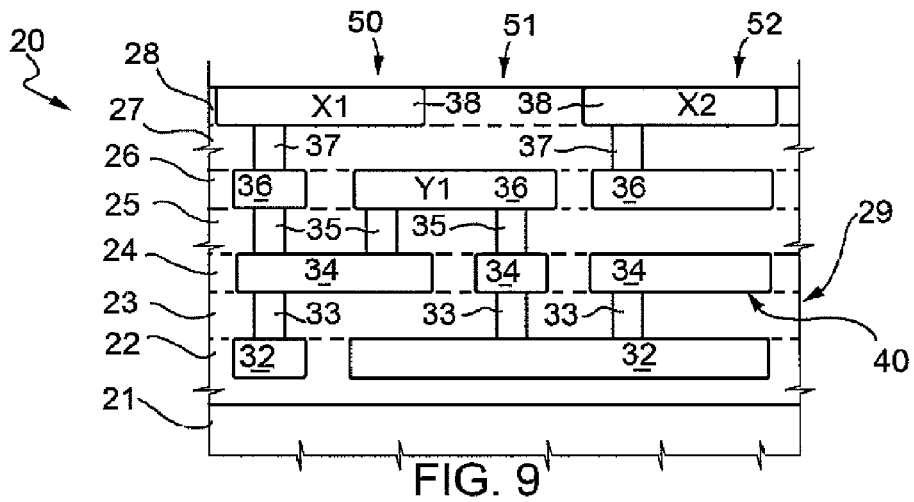

In FIG. 9, a right-hand via connection 35 has been removed to electrically disconnect the right-hand second metal region 34 from the right-hand third metal region 36. A new via connection 35 has been formed in the second via level 25 between the left-hand second metal region 34 and the central third metal region 36, electrically connecting them. In this way, an electrical connection between first terminal X1 and third terminal Y1 has been realized by introducing minimum modifications in the second via level 25.

Figure 10:
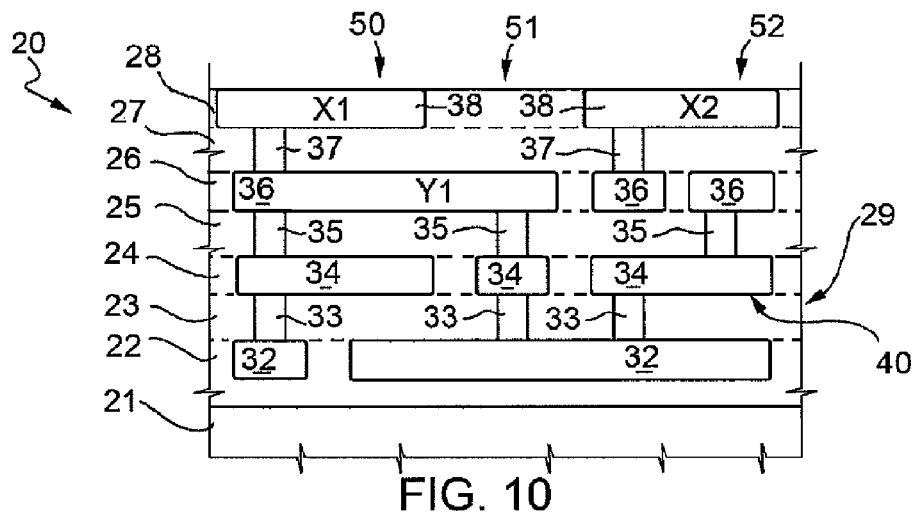

In FIG. 10, the left-hand third metal region 36 has been extended so as to include also the central third metal region 36 (third terminal Y1), while the right-hand third metal region 36 has been divided in two parts, electrically disconnected from each other.

Figure 11:
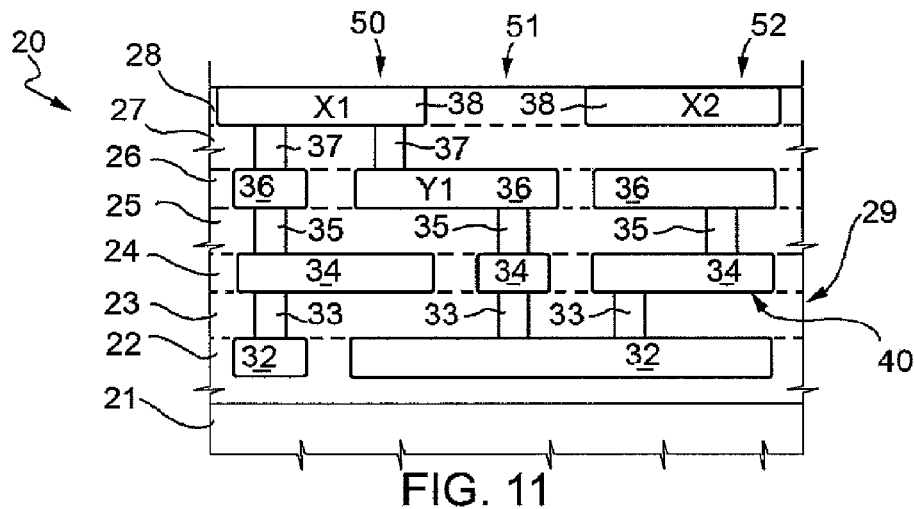

In FIG. 11, a right-hand via connection 37, connecting the right-hand third metal region 36 to the right-hand fourth metal region 38 (second terminal X2) has been removed, and a new via connection 37 has been formed between the central third metal region 36 (third terminal Y1) and the left-hand fourth metal region 38 (first terminal X1). A direct electrical connection is thus established between first terminal X1 and third terminal Y1 by means of via connection 37.

Figure 12:
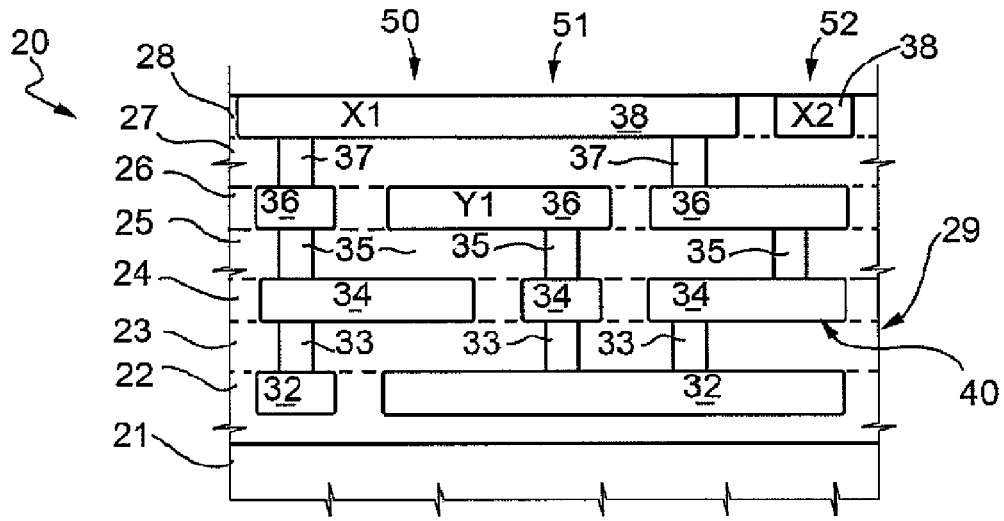

In FIG. 12, the left-hand fourth metal region (first terminal X1) has been extended so to partially overlap the right-hand third metal region 36 and the right-hand via connection 37; consequently, the right-hand fourth metal region 38 has been shortened and electrically disconnected from the metal network 40.

The same principle, used to obtain alternative ways to connect first terminal X1 with third terminal Y1, can be applied to connect second terminal X2 with third terminal Y1, thus providing a number of alternative connections that can be implemented in any chosen metal level 22, 24, 26, 28 or via level 23, 25, 27. As demonstrated, the proposed solution allows the manufacturer to freely choose the single metal or via level to be modified for obtaining the desired connection; therefore the other metal and via levels remain unmodified and can be dedicated to other purposes.

Many alternatives to the layout proposed in FIG. 4 are possible.

Figure 13:
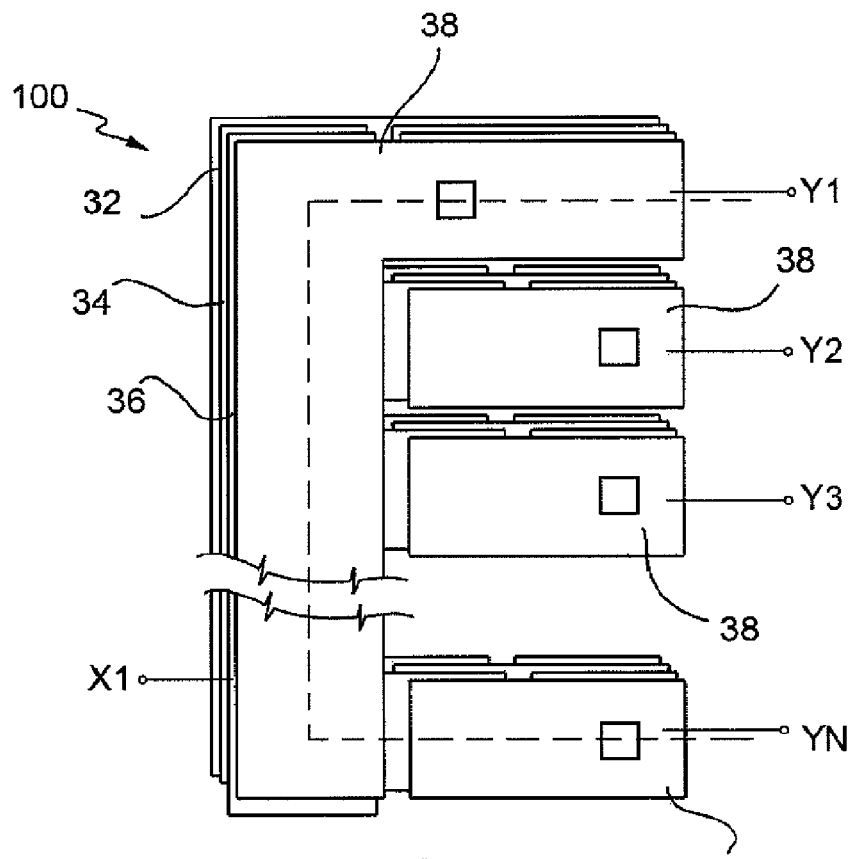
Figure 14A:
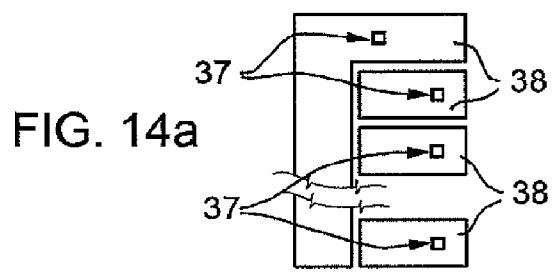
Figure 14B:
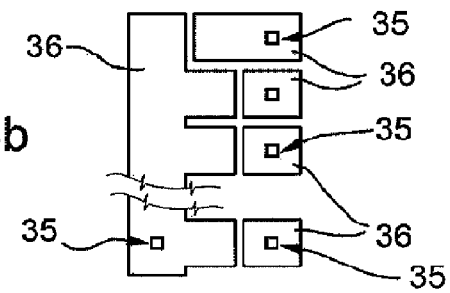
Figure 14C:
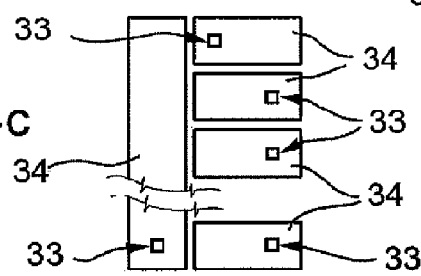
Figure 14D:
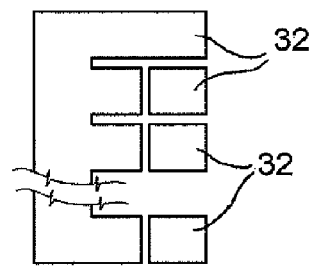

A top view of a first alternative layout for the switch 20 is shown in FIG. 13, while FIGS. 14a-14d, show the shape of the metal regions and via connections of the layout of FIG. 13. The cross-section view of the switch 20 of FIG. 13 is shown in FIG. 15.

Figure 15:
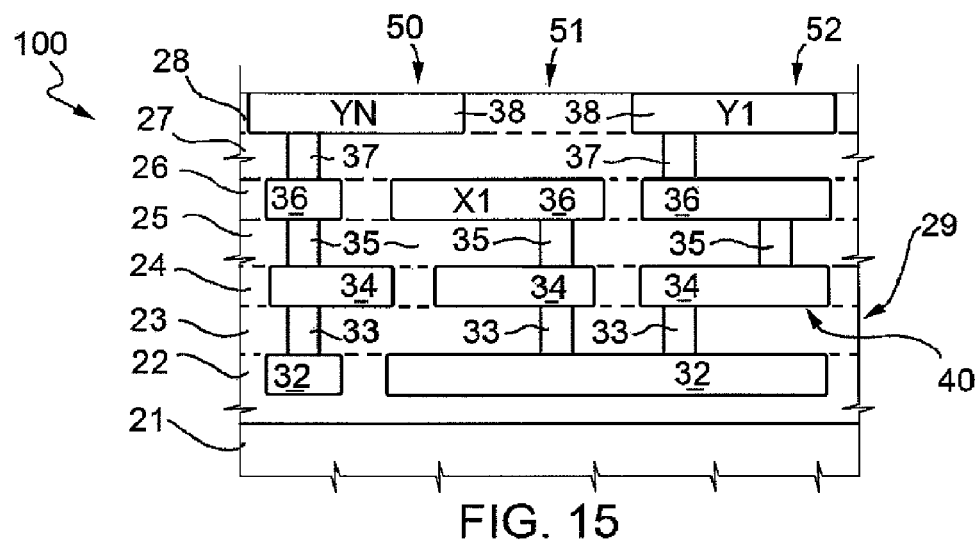

The structure of FIG. 13 (top view) and FIG. 15 (cross-section view, according to the dashed line indicated on FIG. 13) is especially designed for implementing a multi-state switch 100, having one input (X1) and N outputs (Y1, Y2, ..., YN). As visible in FIGS. 14a-14d, the metal regions have here different shapes, for example the fourth metal level is L-shaped, the first metal level is E-shaped and the third metal level is comb-shaped.

According to this embodiment, the number P of metal regions 32, 38 comprised in the top and in the bottom metal levels 22, 28 can be anyone, while the number of metal regions 34, 36 comprised in each intermediate metal level 24, 26 is P+1. Also here, by modifying a single metal level or a single via level during the development process, one can freely choose, accordingly to any particular need or design rule, the favorite connection from the input (X1) to one of the outputs (Y1, Y2 ..., YN) through the metal network 40. The same applies if X1 is in output and Y1-YN are inputs.

Figure 16:
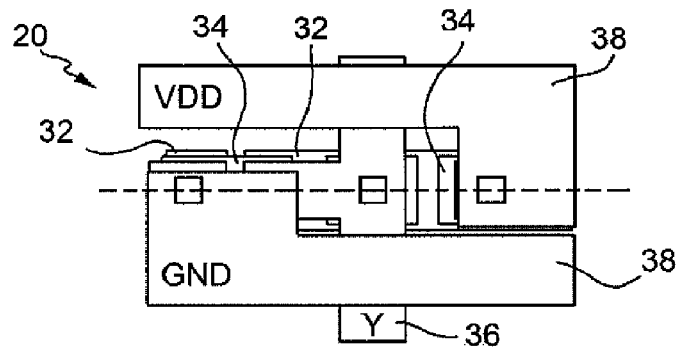
Figure 17A:
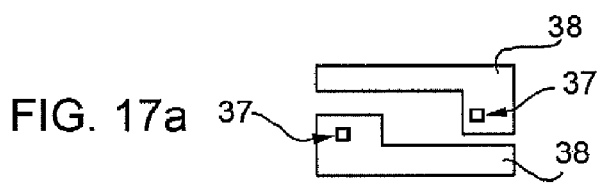
Figure 17B:
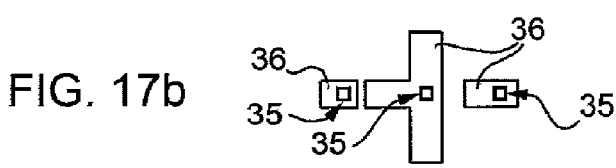
Figure 17C:
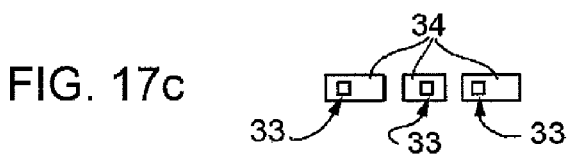
Figure 17D:
Figure 18:
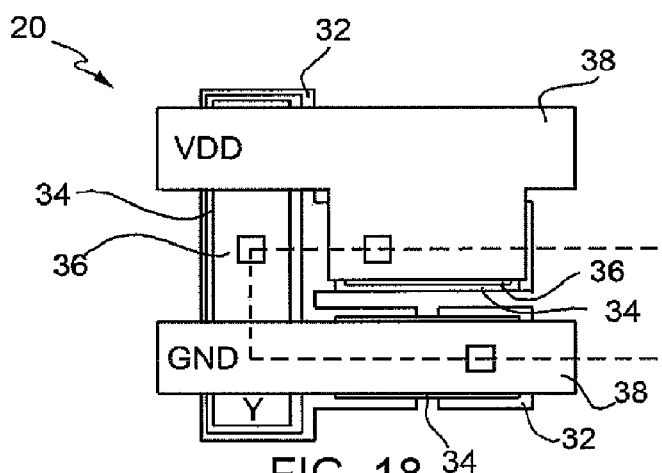

FIG. 16 and FIG. 18 show further alternative layouts for the switch 20, while FIGS. 17a-17d, and FIGS. 19a-19d, show respectively the shape of the metal regions and via connections of the layouts of FIGS. 16 and 18. Here, the shapes of the metal regions include, beside of rectangles and L-shape, also T-shape.

Of course many other layouts are possible, with different top views but analogous cross-sections (the cross-section is considered according to the dashed line indicated on FIG. 16 and FIG. 18). The choice of a particular layout for the metal regions is due to technical and practical considerations.

The metal regions could be reduced or increased in dimensions, and the signal applied to the terminals (X1 and X2 or Y1 in FIG. 3) could be of various nature and sign (as shown, for example, in FIGS. 16-17, where a voltage VDD is applied to second terminal X2, while first terminal X1 is connected to ground GND).

Figure 21:
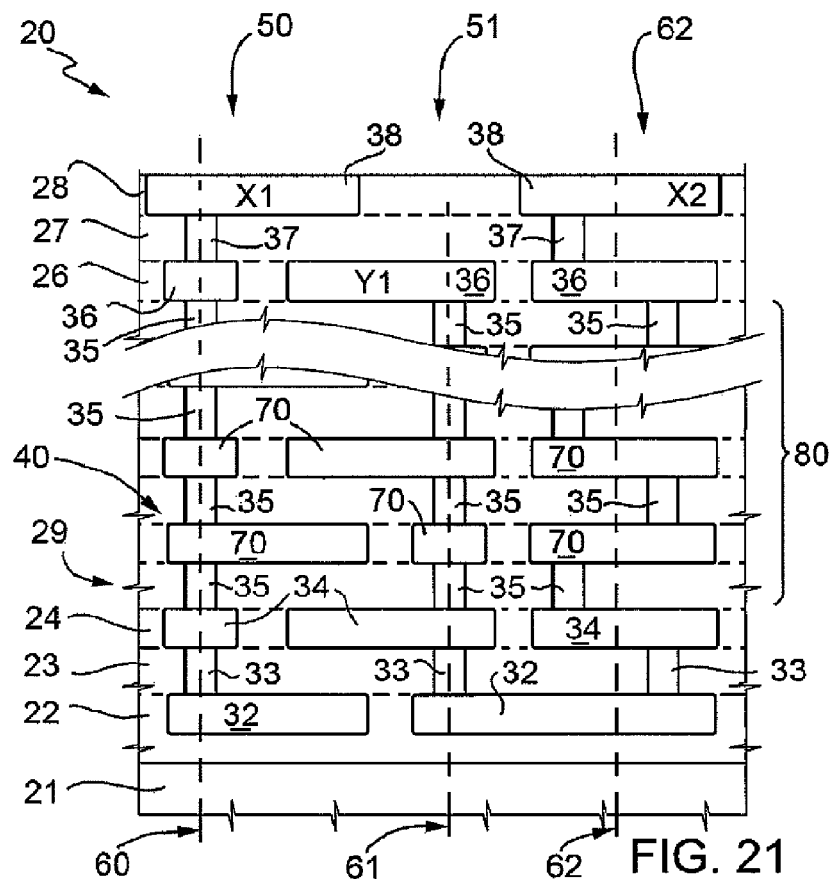

Moreover, as shown in FIGS. 20 and 21, the number M of metal levels can be any number (even or odd) while the number of via levels is M-1. In these figures, the metal regions defining first terminal X1 and second terminal X2 are formed in the $M^{th}$ metal level, while the metal region defining Output is formed in the $(M-1)^{th}$ metal level. FIGS. 20 and 21 differ in the dimension (length) of the metal regions of each stack. For example, in FIG. 20, the left stack has a short left-hand first metal region 32 and the right-hand bottom metal region 32 is longer; the higher levels 24, 26, 28, 80 comprise alternatively long and short metal regions 34, 36, 38, 70. In FIG. 21, the left-hand first metal region 32 is longer and the right-hand first metal region 32 is shorter; since also here the higher levels 24, 26, 28, 80 comprise alternatively long and short metal regions 34, 36, 38, 70, the length of the metal regions 34, 36, 38, 70 in FIG. 21 is opposite to FIG. 20.

In both FIGS. 20 and 21, the via connections 33, 35, 37 of the third stack 52 are arranged alternately on either sides of the third vertical axis 62 and aligned along two parallel vertical axes. Therefore, each via connection 33, 35, 37 is offset with respect to a preceding and/or a subsequent via connection, with the via connections of the odd via levels aligned to each other and the via connections of the even via levels aligned to each other.

Figure 22:
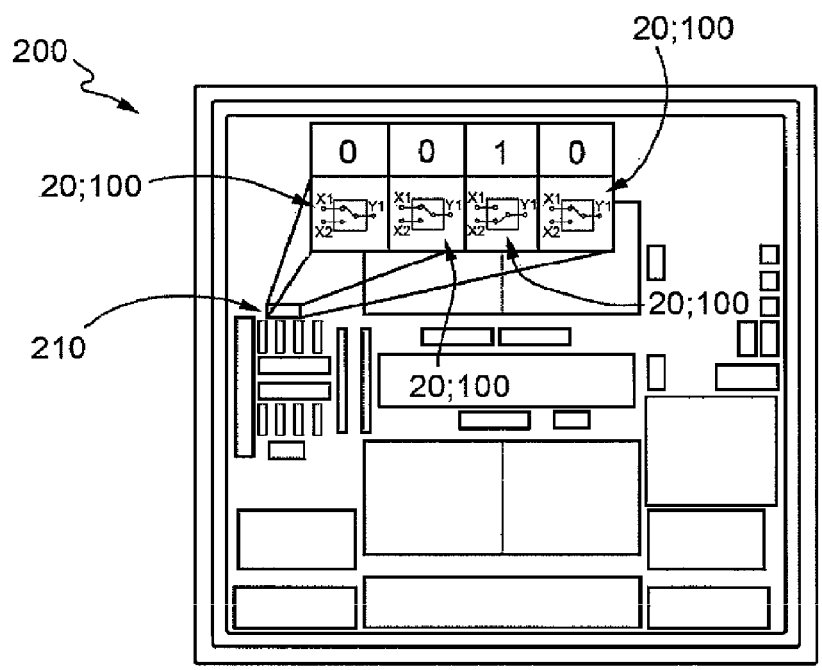
FIG. 22 shows a chip including a chip version register comprising a plurality of switches of FIG. 3.

The present layout may be applied for reprogramming a chip version register 210 implemented in a chip 200. A chip version register 210 (see FIG. 22) can be implemented in binary code as a sequence of bits (0, and 1), where each bit physically implemented by a switch 20, 100 as described above. The chip version register 210 may be reprogrammed by modifying the metal connections of each switch 20, 100 so to define new connections that represent new bit values for the version register 210. Using the layout discussed above, the actual number of the register bit values can be implemented by modifying only one metal level or via level for each bit to be modified.

Finally, it is clear that numerous variations and modifications may be made to the layout and process described and illustrated herein, all falling within the scope of the invention as defined in the attached claims.

For example, although all examples described therein include at least four metal levels, the same solution may be implemented using three or more metal levels. Furthermore, the present layout also allows, during or prior to device fabrication, the substitution of a single metal mask during development process of any metal or via level to select any particular configuration, for example to implement a connection between the metal regions forming first terminal X1 and third terminal Y1 or to implement a connection between the metal regions forming second terminal X2 and third terminal Y1. In the alternative embodiment of FIGS. 13 and 15, one can choose to cut the connection between the input X1 and output Y1 and implement a new connection between the input X1 and one of the outputs Y2, Y3, . . . , YN by modifying a single metal or via level only.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated mask-programmable device, comprising:
a plurality of metal levels including a top metal level, a bottom metal level and a first intermediate metal level formed between said top and bottom metal levels;
a plurality of via levels arranged between the bottom and the first intermediate metal levels and between the first intermediate and the top metal levels and connecting each metal level to adjacent metal levels;
said plurality of metal levels forming a first, a second and at least a third terminal, wherein an intermediate metal region of said first intermediate metal level forms the third terminal, and
said top and bottom metal levels comprising at least two metal regions, and said first intermediate metal level comprising at least three metal regions.

2. The integrated mask-programmable device according to claim 1, wherein said metal regions of said top metal level form the first and the second terminals.

3. The integrated mask-programmable device according to claim 1, wherein said metal regions of said top, first intermediate and bottom metal levels form a plurality of stacks, at least two of said stacks including a metal region of said top metal level, each stack including a metal region of said first intermediate metal level and a metal region of said bottom metal level, the metal regions of each stack being at least partially vertically aligned; in each stack, the metal regions of the first intermediate metal level being connected to the metal regions of the top metal level and/or the bottom metal level by at least one respective via connection.

4. The integrated mask-programmable device according to claim 3, wherein the via connections of a first stack are aligned along two parallel vertical axes, with each via connection being offset with respect to a preceding and/or a subsequent via connection of the first stack.

5. The integrated mask-programmable device according to claim 3, wherein the via connections of a second and a third stacks are aligned along respective vertical axes.

6. The integrated mask-programmable device according to claim 3, comprising a plurality of further intermediate metal levels arranged between the bottom metal level and the first intermediate metal level and connected to said bottom and/or first intermediate metal levels by respective further via connections; each via connection of a first stack being offset with respect to a preceding and/or a subsequent via connection, via connections of odd via levels being aligned to each other and via connections of even via levels being aligned to each other.

7. The integrated mask-programmable device according to claim 6, wherein two stacks of said plurality of stacks share at least one metal region belonging to one of said top, bottom, first and further intermediate metal levels.

8. The integrated mask-programmable device according to claim 1, wherein said metal regions are shaped as polygons.

9. The integrated mask-programmable device according to claim 8, wherein said polygons include at least one shape among rectangle, E-shape, L-shape, comb-shape, T-shape.

10. The integrated mask-programmable device according to claim 1, comprising a fourth terminal, the fourth terminal comprising a metal region vertically overlying metal regions of said first intermediate metal level and said bottom metal level.

11. The integrated mask-programmable device according to claim 10, forming a multi-state switch, having one input and a plurality of outputs.

12. The integrated mask-programmable device according to claim 10, forming a multi-state switch, having a plurality of inputs and an output.

13. The integrated mask-programmable device according to claim 10, forming a multi-state switch, wherein the top metal level and bottom metal level comprise each a number P of metal regions and the first intermediate metal level comprises a number P+1 of metal regions.

14. A chip including a chip version register formed by a plurality of the integrated mask-programmable device according to claim 1.

15. A method for forming an integrated mask-programmable device, comprising the steps of:
forming a plurality of metal levels including a top metal level, a bottom metal level and a first intermediate metal level formed between said top and bottom metal levels;
forming a plurality of via levels arranged between the bottom and the first intermediate metal levels and between the first intermediate and the top metal levels and connecting each metal level to adjacent metal levels, said plurality of metal levels defining a first, a second and at least a third terminal, wherein an intermediate metal region of said first intermediate metal level forms the third terminal;

said top and bottom metal levels comprising at least two metal regions, and said first intermediate metal level comprising at least three metal regions;

connecting said first terminal to said third terminal or said second terminal to said third terminal by modifying a single metal or via level.

16. An integrated mask-programmable device, comprising:
   a plurality of metal levels including a top metal level, a first intermediate metal level, and a second intermediate metal level formed between said top and bottom metal levels;
   a plurality of via levels arranged between the bottom and the top metal levels and connecting each metal level to adjacent metal levels;
   said plurality of metal levels forming a first, a second and at least a third terminal, and
   said top and bottom metal levels comprising at least two metal regions, and said first and second intermediate metal levels comprising at least three metal regions.

17. The integrated mask-programmable device according to claim 16, wherein said metal regions of said top metal level form the first and the second terminals and an intermediate metal region of said first intermediate metal level forms the third terminal.

18. The integrated mask-programmable device according to claim 16, wherein said metal regions of said top, first intermediate, second intermediate and bottom metal levels form a plurality of stacks, at least two of said stacks including a metal region of said top metal level, each stack including a metal region of said first intermediate metal level, a metal region of said first intermediate metal level and a metal region of said bottom metal level, the metal regions of each stack being at least partially vertically aligned; in each stack, the metal regions of the first intermediate metal level being connected to the metal regions of the top metal level and/or the bottom metal level by at least one respective via connection.

19. The integrated mask-programmable device according to claim 16, wherein said metal regions are shaped as polygons.

20. The integrated mask-programmable device according to claim 19, wherein said polygons include at least one shape among rectangle, E-shape, L-shape, comb-shape, T-shape.

21. The integrated mask-programmable device according to claim 16, comprising a fourth terminal, the fourth terminal comprising a metal region vertically overlying metal regions of said first intermediate metal level and said bottom metal level.

22. The integrated mask-programmable device according to claim 16, forming a multi-state switch, having a plurality of inputs and an output.

23. The integrated mask-programmable device according to claim 16, forming a multi-state switch, wherein the top metal level and bottom metal level comprise each a number P of metal regions and the first and second intermediate metal levels comprises a number P+1 of metal regions.

24. A method for forming an integrated mask-programmable device, comprising the steps of:
   forming a plurality of metal levels including a top metal level, a bottom metal level, a first intermediate metal level and a second intermediate metal level formed between said top and bottom metal levels;
   forming a plurality of via levels arranged between the bottom and the top metal levels and connecting each metal level to adjacent metal levels, said plurality of metal levels defining a first, a second and at least a third terminal;
   said top and bottom metal levels comprising at least two metal regions, and said first intermediate metal level comprising at least three metal regions;
   connecting said first terminal to said third terminal or said second terminal to said third terminal by modifying a single metal or via level.

* * * * *

UNITED STATES PATENT AND TRADEMARK OFFICE
CERTIFICATE OF CORRECTION

| | | |
|---|---|---|
| PATENT NO. | : 8,134,187 B2 | Page 1 of 1 |
| APPLICATION NO. | : 12/343621 | |
| DATED | : March 13, 2012 | |
| INVENTOR(S) | : Patrik Vacula et al. | |

It is certified that error appears in the above-identified patent and that said Letters Patent is hereby corrected as shown below:

Col. 3, line 11, should read:
According to another embodiment, there is provided a Signed and Sealed this
First Day of May, 2012

David J. Kappos
*Director of the United States Patent and Trademark Office*